(12) United States Patent
Ciarcia (10) Patent No.: US 12,379,411 B2
(45) Date of Patent: *Aug. 5, 2025

(54) CIRCUIT AND METHOD FOR TESTING A CIRCUIT

(71) Applicant: Infineon Technologies AG, Neubiberg (DE)

(72) Inventor: Alessio Ciarcia, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/473,354

(22) Filed: Sep. 25, 2023

(65) Prior Publication Data

US 2024/0103067 A1    Mar. 28, 2024

Related U.S. Application Data

(63) Continuation of application No. 17/953,347, filed on Sep. 27, 2022.

(51) Int. Cl.
    *G01R 31/28* (2006.01)
(52) U.S. Cl.
    CPC ................................ *G01R 31/2851* (2013.01)
(58) Field of Classification Search
    CPC ................................................. G01R 31/2851
    See application file for complete search history.

(56) References Cited

U.S. PATENT DOCUMENTS 4,740,970 A * 4/1988 Burrows ........ G01R 31/318541
                                                714/733
4,947,395 A * 8/1990 Bullinger ....... G01R 31/318558
                                                714/730
(Continued)

FOREIGN PATENT DOCUMENTS

CN    107526019 A  * 12/2017  ......... G01R 31/2851
CN    115078956 A  *  9/2022
(Continued)

OTHER PUBLICATIONS

Machine translation of CN107526019A (Year: 2017).*
(Continued)

*Primary Examiner* — Lee E Rodak
*Assistant Examiner* — Sangkyung Lee
(74) *Attorney, Agent, or Firm* — Viering, Jentschura & Partner mbB (57) ABSTRACT

According to various embodiments, a circuit is described including a plurality of scan flip-flops including a sequence of scan flip-flops, wherein at least some scan flip-flops of the sequence are wrapper scan flip-flops, and including, for each scan flip-flop of at least a subset of the scan flip-flops, at the wrapper scan flip-flop's test input a respective test input circuit configured to, when supplied with a mode control signal having a first value, connect the test input to the output of the preceding wrapper scan flip-flop such that the test input of the flip-flop is supplied with the content of the preceding wrapper scan flip-flop and when supplied with the mode control signal having a second value, connect the test input to an output of a part of the circuit such that the test input of the flip-flop is supplied with a value depending on a test result.

10 Claims, 8 Drawing Sheets

SHIFT

(56) References Cited

U.S. PATENT DOCUMENTS

| | | | |
|---|---|---|---|
| 6,108,805 | A | 8/2000 | Rajsuman |
| 8,732,540 | B2 | 5/2014 | Lee et al. |
| 9,746,519 | B2 | 8/2017 | Pugliesi-Conti |
| 11,879,942 | B1* | 1/2024 | Shivaray ........ G01R 31/318566 |
| 2001/0052096 | A1 | 12/2001 | Huijbregts |
| 2002/0136064 | A1 | 9/2002 | Yoshiyama |
| 2003/0043748 | A1* | 3/2003 | Gabara .......... G01R 31/318525 |
| | | | 370/465 |
| 2003/0088836 | A1 | 5/2003 | Kanazawa et al. |
| 2005/0039093 | A1 | 2/2005 | Bailliet |
| 2006/0041806 | A1* | 2/2006 | Okada ............ G01R 31/318594 |
| | | | 714/726 |
| 2006/0129900 | A1* | 6/2006 | Clark ............. G01R 31/318575 |
| | | | 714/726 |
| 2013/0007547 | A1* | 1/2013 | Tekumalla ..... G01R 31/318536 |
| | | | 714/E11.155 |
| 2015/0325314 | A1 | 11/2015 | Ziaja et al. |
| 2015/0331044 | A1 | 11/2015 | Jajodia et al. |
| 2016/0169966 | A1* | 6/2016 | Abshishek ..... G01R 31/318541 |
| | | | 714/727 |
| 2016/0209468 | A1 | 7/2016 | Sato |
| 2016/0349320 | A1* | 12/2016 | Laisne ............. G01R 31/31724 |
| 2016/0356850 | A1* | 12/2016 | Whetsel ............. G01R 31/3173 |
| 2018/0031631 | A1* | 2/2018 | Srinivasan ..... G01R 31/318541 |
| 2019/0018062 | A1 | 1/2019 | Urard et al. |
| 2019/0235019 | A1 | 8/2019 | Ziaja et al. |
| 2020/0300914 | A1 | 9/2020 | Watanabe et al. |
| 2021/0325457 | A1 | 10/2021 | Wong et al. |

FOREIGN PATENT DOCUMENTS

| | | |
|---|---|---|
| JP | 2001296331 A | 10/2001 |
| JP | 2003518631 A | 6/2003 |
| JP | 2003307547 A | 10/2003 |
| JP | 2004336123 A | 11/2004 |
| JP | 3595310 B2 | 12/2004 |
| JP | 2006268439 A | 10/2006 |
| JP | 3937032 B2 | 6/2007 |

OTHER PUBLICATIONS

Machine translation of CN115078956A (Year: 2022).*

Final Office Action issued for the corresponding U.S. Appl. No. 17/953,347, dated Apr. 9, 2024, 28 pages (For informational purposes only).

Non-Final Office Action issued for the corresponding U.S. Appl. No. 17/953,347, dated Dec. 8, 2023, 17 pages (for informational purposes only).

* cited by examiner

CIRCUIT AND METHOD FOR TESTING A CIRCUIT

CROSS-REFERENCE TO RELATED APPLICATIONS

This application is a continuation of U.S. application Ser. No. 17/953,347, filed on Sep. 27, 2022, the entirety of which is incorporated herein by reference.

TECHNICAL FIELD

Exemplary implementations described herein generally relate to circuits and methods for testing circuits.

BACKGROUND

Integrated circuits, for example microcontrollers (MCUs) such as those used in vehicles, must meet high quality standards. In particular, functional safety standards require high coverage (up to 90% or even 99%). To achieve such a test coverage, a lot of test points in a chip are required, in particular observation points, i.e. points where the result produced by circuitry of the chip in response to a test pattern can be observed for evaluation. Such observation points may be implemented by adding additional flip-flops to the chip. However, adding additional flip-flops to the hundreds of thousands of flip-flops that may already be provided in the design of a chip is typically undesirable and further increases the cost of the chip.

Therefore, approaches for testing integrated circuits are desirable that require few additional flip-flops.

SUMMARY

According to various embodiments, a circuit is provided including a plurality of scan flip-flops including a sequence of scan flip-flops, wherein at least some scan flip-flops of the sequence of scan flip-flops are wrapper scan flip-flops, each scan flip-flop of the sequence having a D input, a test enable input, a test input and a data output, wherein the circuit includes, for each scan flip-flop of at least a subset of the scan flip-flops of the sequence, at the scan flip-flop's test input a respective test input circuit configured to, when supplied with a mode control signal having a first value indicating a shift mode, connect the test input to the output of the scan flip-flop preceding the scan flip-flop in the sequence such that the test input of the flip-flop is supplied with the content of the scan flip-flop preceding the scan flip-flop in the sequence and when supplied with the mode control signal having a second value indicating a capture mode, connect the test input to an output of a part of the circuit such that the test input of the flip-flop is supplied with a value depending on a test result provided by the part of the circuit.

According to a further embodiment, a method for testing a circuit as described above is provided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION OF EXEMPLARY IMPLEMENTATIONS

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Figure 1:
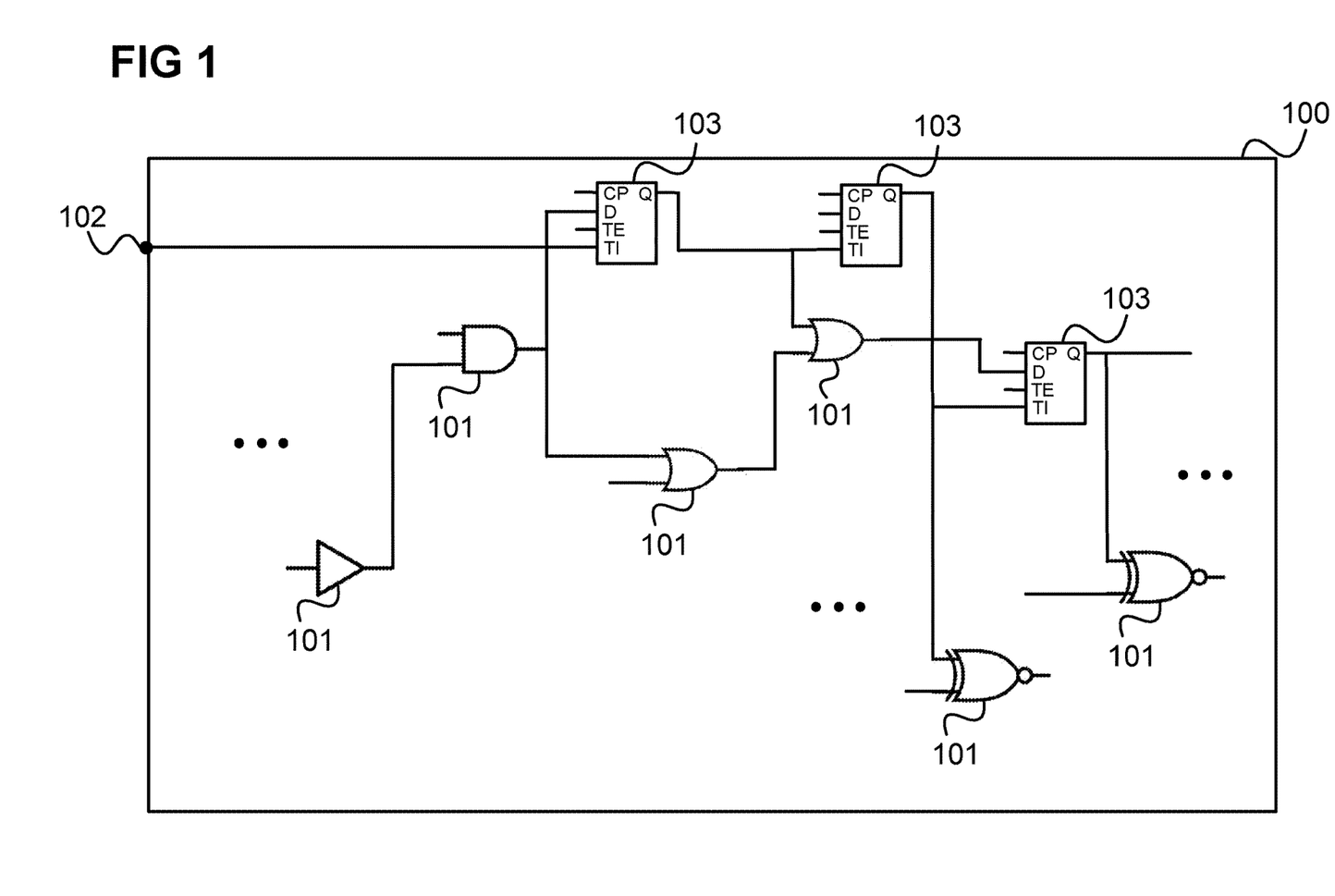
FIG. 1 shows an integrated circuit (or chip) according to one embodiment.

FIG. 1 shows an integrated circuit (or chip) 100 according to one embodiment.

The integrated circuit 100 is, for example, a microcontroller, e.g., for an ECU (electronic control unit) in a vehicle, or as a smart card module for a smart card of any form factor.

As is typically the case, the integrated circuit 100 has a plurality of logic gates 101 (AND gates, NON-OR gates, exclusive-OR gates, inverters, . . . ) interconnected by interconnection lines. The logic gates 101 are cells from a chip design library and they may be more complex circuits (e.g., complex gates).

The integrated circuit also has flip-flops 103 connected to the logic gates 101. At least some of the flip-flops 103 are provided as scan flip-flops to allow test patterns to be loaded into the scan flip-flops for testing the integrated circuit. A scan flip-flop is a D flip-flop with a multiplexer added at the input, where one input of the multiplexer functions as a function input D and the other input serves as a test input (TI). CP denotes the clock input (connected to a clock signal line not shown for simplicity). The test pattern is pushed into the flip-flops 103 (each via the test input) via one or more test input pins 102, for example. A test enable signal supplied to a test enable input (TE, connection to test enable signal line not shown for simplicity) switches the multiplexer of the scan flip-flop from the data input (D) to the test input (TI) for testing.

It may be desirable to not test a chip as a whole but only a sub-design (i.e. a sub-circuit) of the chip. For this, scan flip-flops 103 may be used as wrapper cells to isolate the (sub-)circuit to be tested from the rest of the chip.

Figure 2:
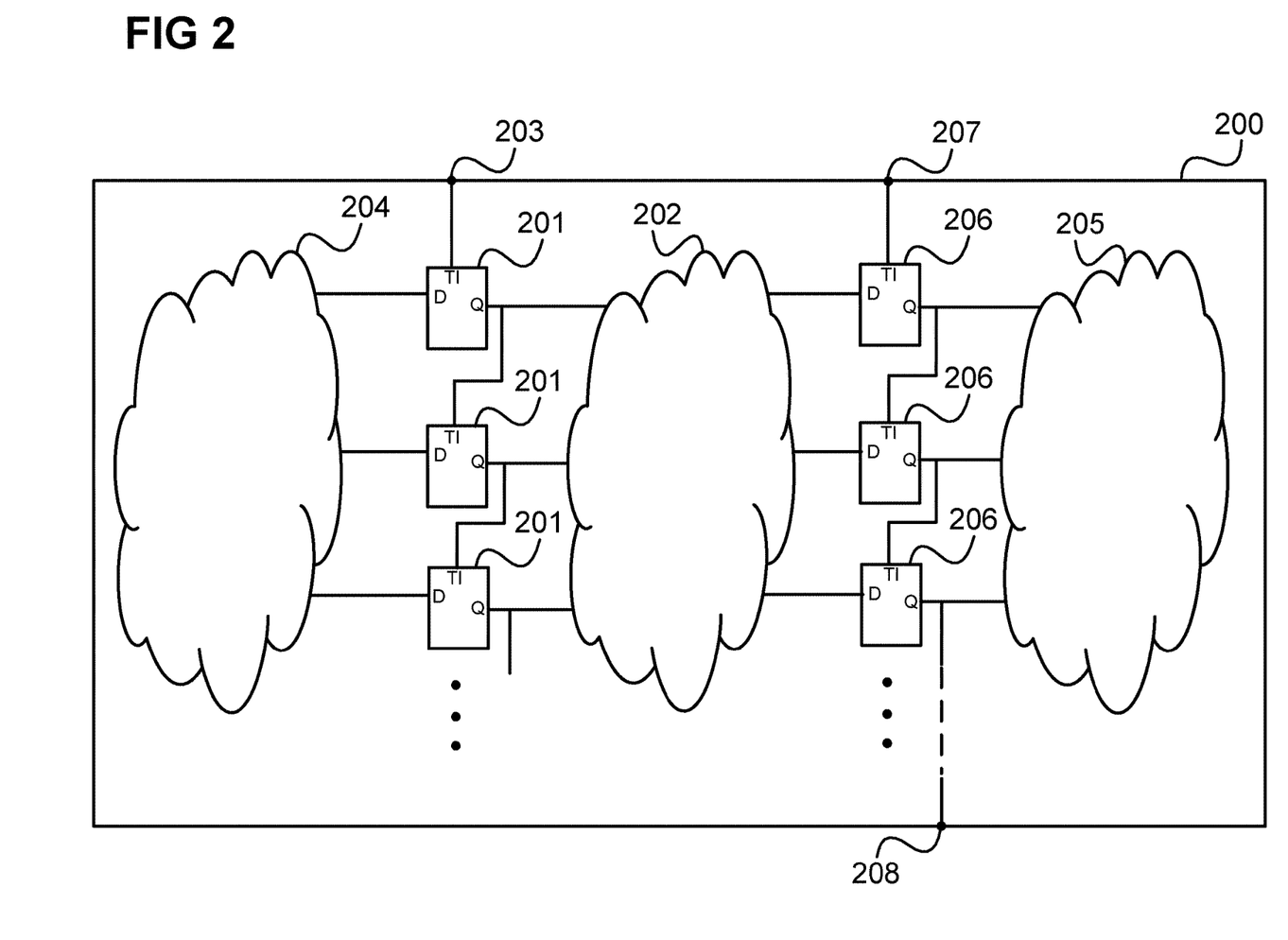
FIG. 2 illustrates the usage of scan flip-flops as wrapper cells for testing a sub-circuit of a chip.

FIG. 2 illustrates the usage of scan flip-flops as wrapper cells 201 for testing a sub-circuit 202 of a chip 200.

A scan flip-flop in the configuration of a wrapper cell (in a respective integrated circuit) is also referred to herein as wrapper scan flip-flop. In this example, there is a chain of wrapper cells 201 formed by connecting scan flip-flops via their test inputs as explained with reference to FIG. 1. So, the output of each wrapper cell 201 is connected to the next wrapper cell 201 in the chain as well as to the circuit to be tested 202. Via the test enable input, the chain of wrapper cells 201 may be switched between providing (i.e. forwarding) outputs of a preceding circuit 204 (which they receive via their D inputs) and providing a test pattern (which is shifted into the chain of wrapper cells 201 from a test input pin 203) to the circuit to be tested 202.

Figure 3:
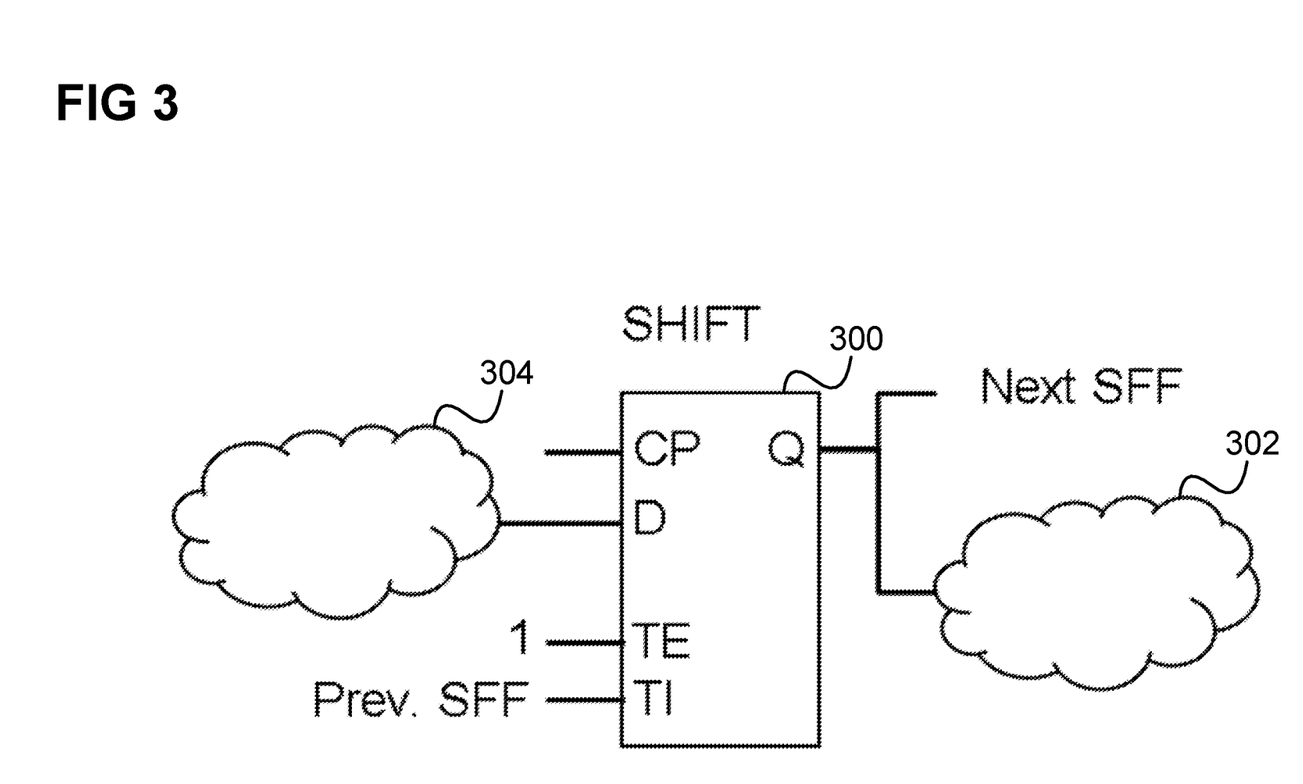
FIG. 3 illustrates a wrapper cell.

FIG. 3 illustrates one of the wrapper cells 300.

As explained with reference to FIG. 1 and FIG. 2, the wrapper cell 300 has a clock input (CP), a D input, a test enable input (TE), a test input (TI) and a Q output.

The D input is connected to the preceding circuit 204, 304. The Q output is connected to the TI input of the subsequent wrapper cell as well as the circuit to be tested 202, 302 (wherein this connection may have a certain functional fan-out). As explained above, for testing a circuit to be tested 202, 302 ("middle sub-circuit" in FIG. 3), the test enable input is set to a value (here 1) such that the wrapper cell takes inputs from the preceding wrapper cell (or from the test input 203 if it is the first of the chain) rather than from the preceding circuit 204, 304. This means that for testing the circuit to be tested 202, 302 the chain of wrapper cells 201 is in a shift mode, i.e. with each clock cycle, the content of the chain is shifted by one wrapper cell 201 down the chain. The chain of wrapper cells 201 thus isolates the circuit to be tested 202, 302 from the preceding circuit 204 ("left" sub-circuit in FIG. 2), such that propagation of unexpected values from the preceding circuitry 304 into the circuit to be tested 202, 302 is avoided.

Similarly, for testing a further (subsequent) circuit 205 ("right" sub-circuit in FIG. 2), a further chain of wrapper cells 206 may be provided which may be used to avoid propagation of inputs form the middle (sub-)circuit 202 to the right (sub-)circuit 205, and rather providing a test pattern supplied by a further test input pin 207 (which may also be the same as the test input pin 203) to the right circuit 205 by setting the test enable inputs of the further wrapper cells 206 to 1.

As mentioned above, in addition to having flip-flops like the flip-flops 103, 201, 206 which can be used to provide test inputs, i.e. which may be used as test points, observations points are also needed, i.e. points where the result produced by circuitry to be tested, e.g. the middle circuit 202 in FIG. 2 when provided by a test pattern from the flip-flops 201, can be observed for evaluation. For this, further flip-flops may be introduced which receive the results and provide them to a test output pin. This approach, however, requires introduction of additional flip-flops into the design which may not be desirable.

Therefore, according to various embodiments, scan flip-flops are extended with additional input circuitry at their test input (hereinafter referred to as "extended scan flip-flop") such that they may be used as wrapper cells as well as observation points. For example, the wrapper cells 201 may be configured in that manner such that they may be used as observation points for testing the middle circuit 202 and the further wrapper cells 206 may be configured in that manner such that they may be used as observation points for testing the right circuit 205.

Figure 4:
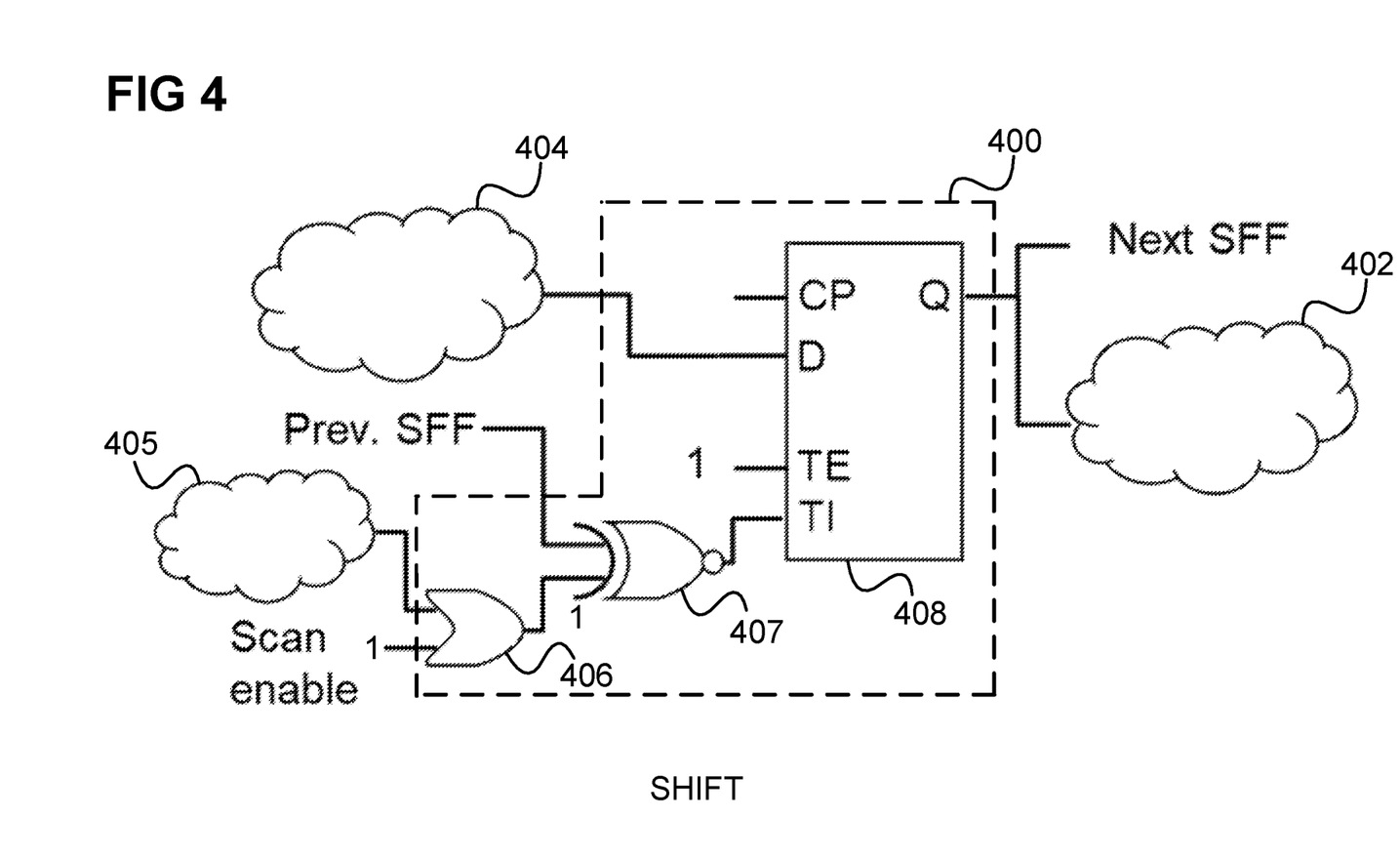
FIG. 4 shows an extended wrapper scan flip-flop when loaded, i.e. in shift mode.

FIG. 4 shows an extended wrapper scan flip-flop 400 when loaded, i.e. in shift mode.

Figure 5:
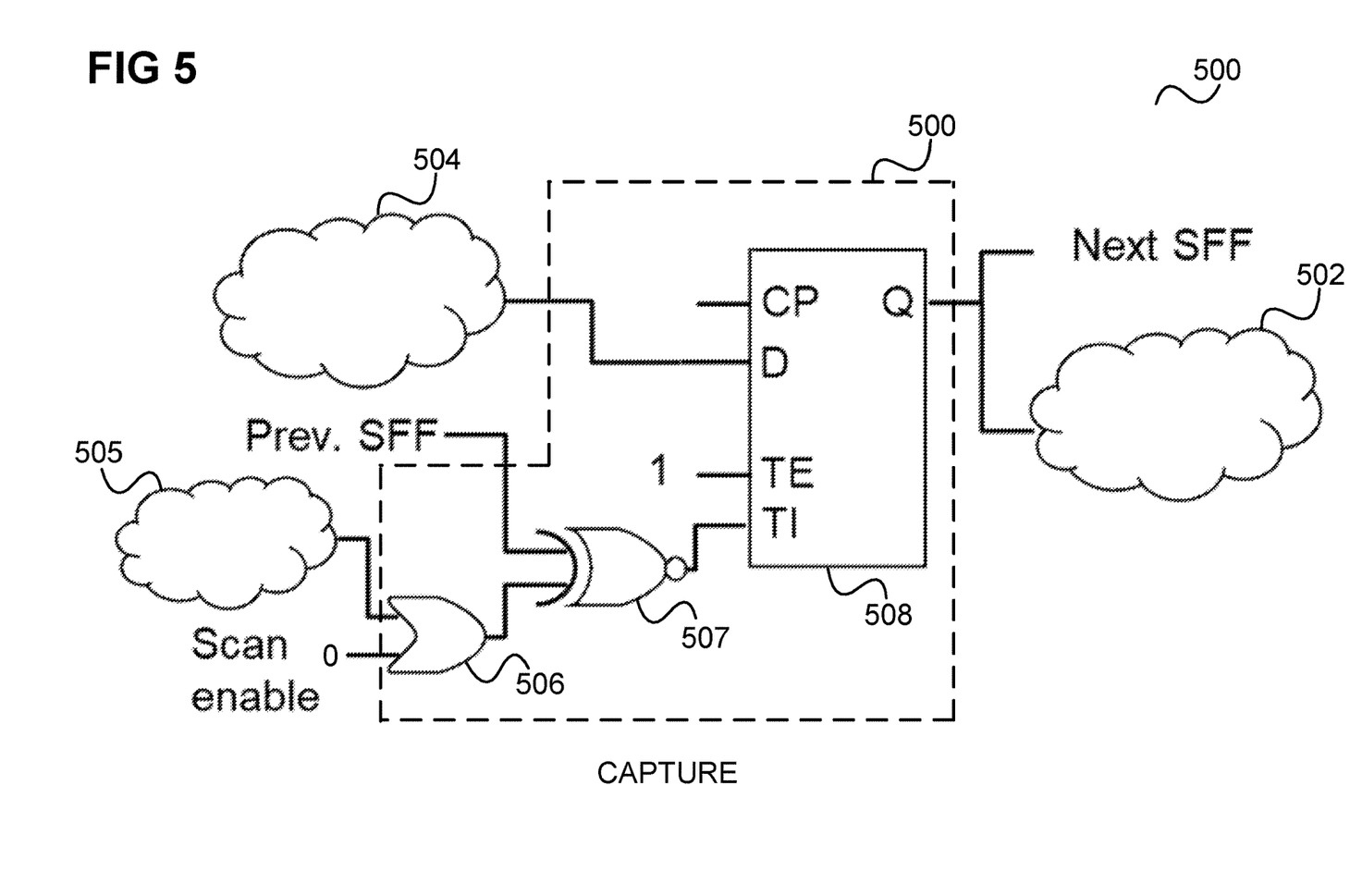
FIG. 5 shows an extended wrapper scan flip-flop when used as observation point, i.e. in observation mode.

FIG. 5 shows an extended wrapper scan flip-flop 500 when used as observation point, i.e. in observation mode.

The extended wrapper scan flip-flop 400, 500 includes a wrapper scan flip-flop 408, 508 which has, as explained above, a clock input CP, a D input, a test enable input (TE) and a test input (TI). Since in both modes illustrated in FIG. 4 and FIG. 5 the wrapper scan flip-flop 400, 500 is used as observation point and acts as wrapper cell, test enable is in both cases set to 1.

The Q output is connected to the subsequent (possibly similarly extended) wrapper scan flip-flop of the chain as well as a circuit 402, 502 which may be tested when using the extended wrapper scan flip-flop 400 in shift mode (e.g. the right circuit 205). If the extended wrapper scan flip-flop 400, 500 is the last in the chain, its output may be connected to a test output pin 208.

The D input is connected, as explained above, to the preceding circuit 404, 504 which should be isolated if the subsequent circuit 402, 502 is to be tested.

In capture mode, the wrapper scan flip-flop 508 receives the output of a circuit to be observed 405, 505. For example, when the middle circuit 202 of FIG. 2 is to be tested, the circuit to be observed 405, 505 is the middle circuit 202.

In shift mode, the wrapper scan flip-flop 408 receives the output of the preceding wrapper scan flip-flop or the test input pin if the extended wrapper scan flip-flop 400 is the first in the chain.

The setting of the extended wrapper scan flip-flop 400, 500 into shift mode (to receive the output of the preceding wrapper scan flip-flop or the test input pin if it is the first in the chain or to shift out observations) and into the capture mode (to receive the output of the preceding circuit 504) is achieved by circuitry at the test input TI (when testing is enabled by TE, i.e. input is taken from TI rather than from D). This circuitry at the test input consists, in the present embodiment, by an OR gate 406, 506 followed by an NXOR (NOT-EXCLUSIVE-OR) gate 407, 507. The OR gate 406, 506 is connected, with one of its input, to an output of the circuit to be observed 405, 505 and with the other input to a scan enable line (which is shared among all the extended wrapper scan flip-flops of the chain). In the present embodiment, the scan enable line is set to 1 for the shift mode and is set to 0 for the capture mode.

The output of the OR gate 406, 506 is connected to one of the inputs of the NXOR gate 407, 507. The other input of the NXOR gate 407, 507 is connected to the output of the preceding (possibly also extended) wrapper scan flip-flop (or the test input pin if the extended wrapper scan flip-flop 400, 500 is the first in the chain). The output of the NXOR gate 407, 507 is connected to the test input of the wrapper scan flip-flop 408, 508.

Thus, if scan enable is set to 1 (i.e. shift mode is enabled), the test input is supplied with the output of the preceding wrapper scan flip-flop (or the test input pin if the extended wrapper scan flip-flop 400, 500 is the first in the chain) since output of the preceding wrapper scan flip-flop (or the test input pin if the extended wrapper scan flip-flop 400, 500 is the first in the chain) is XORed with a 1 (which is an inversion) and after that inverted again.

If scan enable is set to 0 (i.e. capture mode is enabled), the bit supplied to the test input of the wrapper scan flip-flop depends on the result provided by the circuit to be observed 505. This result provided by the circuit to be observed 505 is combined by the output of the preceding wrapper scan flip-flop (or the test input pin if the extended wrapper scan flip-flop 400, 500 is the first in the chain) by the NXOR gate so the wrapper scan flip-flop 508 does not necessarily receive a bit that is equal to the result of the circuit be observed (but may be its inverse). However, the test pattern and the output of the circuit to be tested in response to the test pattern is known when testing and thus, the bit values that should be captured (when the circuit to be tested operates correctly) can be determined and a deviation from these expected values can be detected since somewhere in the chain a wrapper scan flip-flop will receive a bit value which differs from the corresponding reference bit value if not all results of the circuit to be observed 405, 505 are correct.

Thus, by reading out the content of the chain of wrapper scan flip-flops after capturing (e.g. by putting them again into shift mode and shifting their content out via the test output pin 208) and evaluating it allows determining whether the circuit to be tested has operated correctly in response to the test pattern.

It should be noted that possibly, the subsequent circuit 402 in shift mode may be the same as the circuit to be observed 505 in observation mode, i.e. the chain of wrapper scan flip-flops may be used to input a test pattern to a circuit to be tested in one clock cycle and observe the circuit's reaction to the test pattern in the next clock cycle. For this, the test pattern is first shifted into the chain of wrapper scan flip-flops by operating them in shift mode (in a number of test cycles according to the chain's length) and then the wrapper scan flip-flops are set to capture mode to observe the circuit's state when it is provided with the test pattern from the chain of wrapper scan flip-flops.

It should be noted that it is possible to have multiple observation points implemented with one flip-flop by compacting multiple values into a single one (using an XOR tree) and then this single value (which can be seen like a parity bit, i.e. if one of the values is different than expected then this bit would have the opposite value) is captured by the flip-flop.

Figure 6:
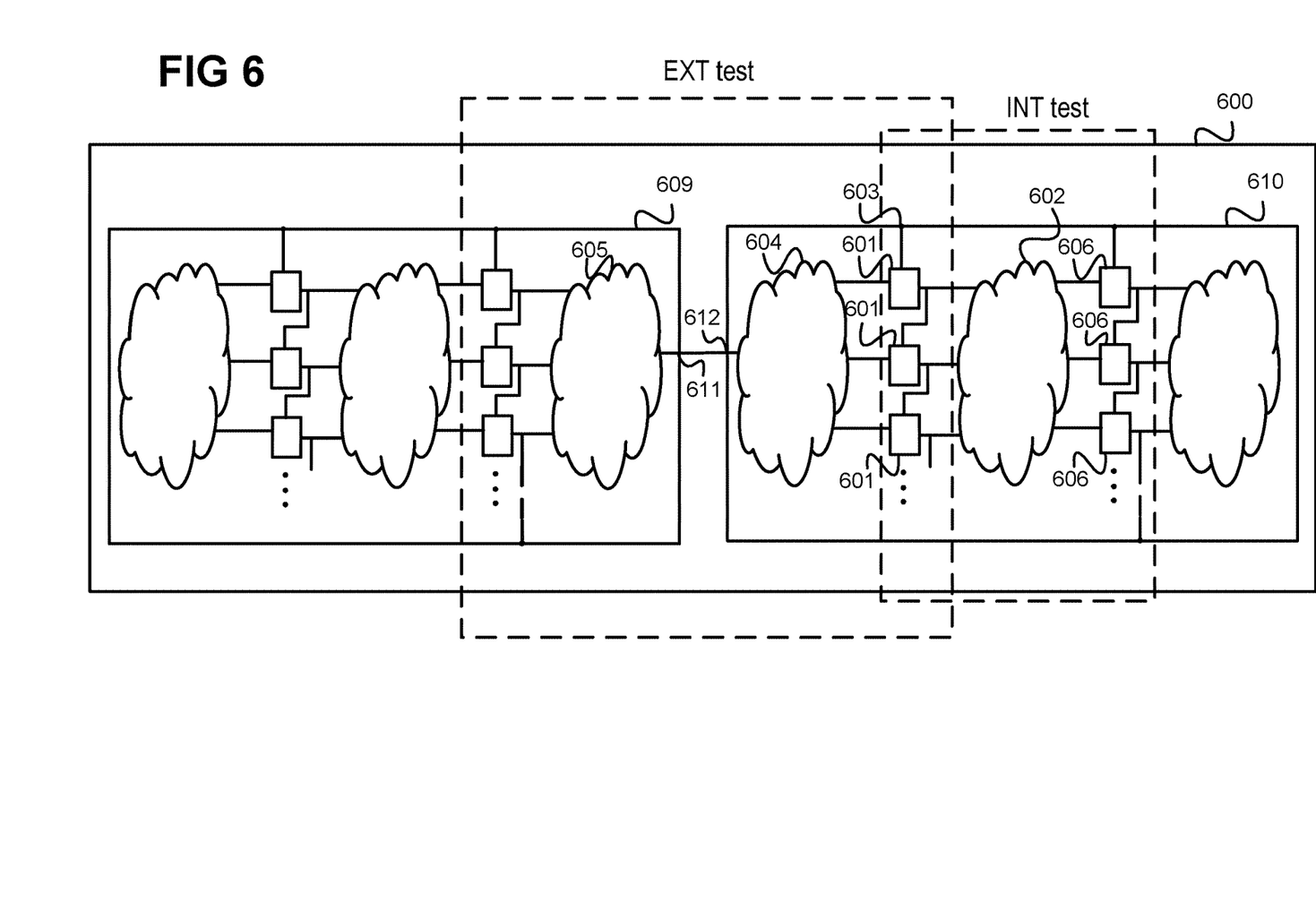
FIG. 6 shows a chip having two chip components each chip component having the structure shown in FIG. 2.

It should further be noted that in a hierarchical chip design, a chip may comprise multiple components having the structure shown in FIG. 2, as illustrated in FIG. 6.

FIG. 6 shows a chip 600 having two chip components 609, 610, each chip component having the structure shown in FIG. 2.

Outputs of the "right" sub-circuit 605 of the first chip component 601 may then be connected to inputs of the "left" sub-circuit 604 of the second chip component by connecting an output port 611 of the first chip component 609 to an input port 612 of the second chip component 610. Accordingly, in such a case, the wrapper cells 601 (corresponding to wrapper cells 201) of the second chip component may be regarded as input wrapper cells and the wrapper cells 606 (corresponding to wrapper cells 206) of the second chip component may in such a case be regarded as output wrapper cells (since a further chip components may be connected to an output port of the second chip component 610). The wrapper cells of the first chip component as 609 may similarly be divided into input wrapper cells (corresponding to 201) and output wrapper cells (corresponding to 206).

In such a case, testing the "left" sub-circuit 604 of the second chip component 610 using test inputs supplied from the first chip component 609 is referred to as EXT test (for external).

In contrast, testing the "middle" sub-circuit 602 using test inputs supplied via the test input pin 603 and the wrapper cells 601 is referred to as an INT test (for internal).

Both input wrapper cells as well as output wrapper cells may be used for observation.

So, for example:

The preceding circuit 504 can be the "left" sub-circuit 604 in an EXT test (when the extended wrapper scan flip-flop 500 corresponds to an input wrapper cell 601 and observation is done via the D input)

The circuit to be observed 505 is the "left" sub-circuit 604 in an EXT test (when the extended wrapper scan flip-flop 500 corresponds to an output wrapper cell 606 and observation is done via the TI input)

The preceding circuit 504 is the "middle" sub-circuit 602 in an INT test (when the extended wrapper scan flip-flop 500 corresponds to an output wrapper cell 606 and observation is done via the D input)

The circuit to be observed 505 is the "middle" sub-circuit 602 or the "right" sub-circuit 605) during an INT test (when the extended wrapper scan flip-flop 500 corresponds to an input wrapper cell 601 and observation is done via the TI input)

It should further be noted that in some cases, the number of wrapper scan flip-flops present in the chip or chip component may not be sufficient to carry out the required testing or the wrapper scan flip-flops may be located such that it would require significant routing to carry out the required testing, requiring more interconnects on the semiconductor die. To enable testing or reduce the routing effort in such cases, according to various embodiments, other scan flip-flops than wrapper scan flip-flops may be used in the sequences of scan flip-flops 201 and 206, i.e. the scan flip-flop sequences 201, 206 do not have to be formed only of (input or output) wrapper scan flip-flops but may also include other scan flip-flops.

Figure 7:
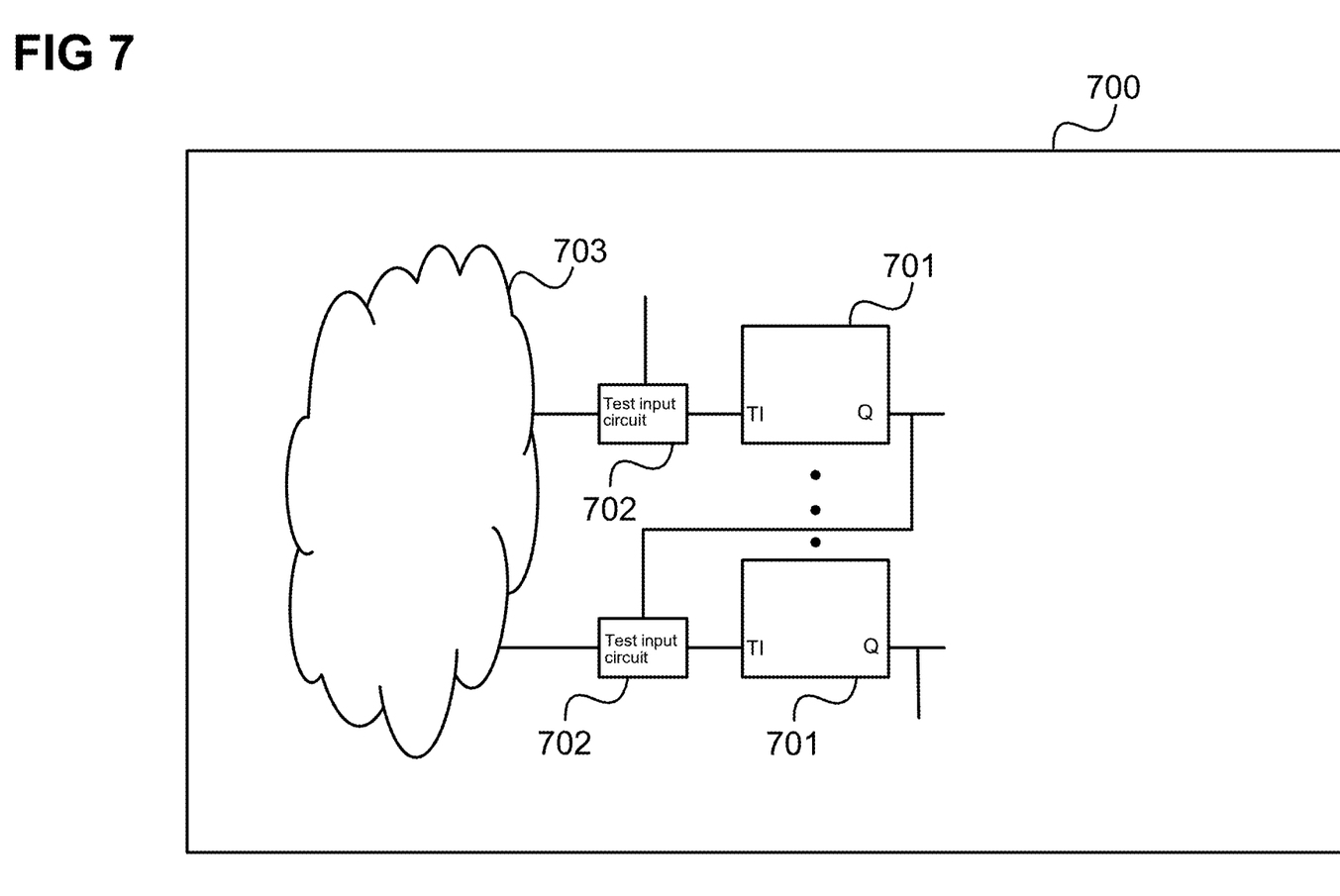
FIG. 7 shows a circuit including a sequence of wrapper scan flip-flops, each wrapper scan flip-flop having a D input, a test enable input, a test input and a data output.

In summary, according to various embodiments, a (integrated) circuit is provided as illustrated in FIG. 7.

FIG. 7 shows a circuit 700 including a plurality of scan flip-flops including a sequence of scan flip-flops 701, wherein at least some scan flip-flops of the sequence of scan flip-flops are wrapper scan flip-flops, each scan flip-flop 701 of the sequence having a D input, a test enable input, a test input (TI) and a data output (Q).

The circuit 700 includes, for each scan flip-flop 701 of at least a subset of the scan flip-flops of the sequence (wherein the subset includes at least one or some of the wrapper scan flip-flop of the sequence), at the scan flip-flop's test input a respective test input circuit 702 configured to, when supplied with a mode control signal having a first value indicating a shift mode, connect the test input to the output of the scan flip-flop preceding the scan flip-flop in the sequence such that the test input of the flip-flop is supplied with the content of the scan flip-flop preceding the scan flip-flop in the sequence and when supplied with the mode control signal having a second value indicating a capture mode, connect the test input to an output of a part of the circuit 703 such that the test input of the flip-flop is supplied with a value depending on a test result provided by the part of the circuit.

According to various embodiments, in other words, at least some (possibly a large number or even all) scan flip-flops in a chain of scan flip-flops are provided with circuitry at their test inputs which allows them to be operated as a "usual" chain of cells (i.e. for shifting in a scan pattern) and allows them to be operated as observation points, i.e. for capturing test results provided by a part of the circuit (which may be seen as (sub-)circuit under test).

This allows implementing observation points with less additional chip area since no dedicated observation points are required, thus reducing the overall size of the respective chip or freeing space for more test points to achieve higher test coverage or less tests for the same test coverage. Further, shorter scan chains may be implemented to reduce test time.

Figure 8:
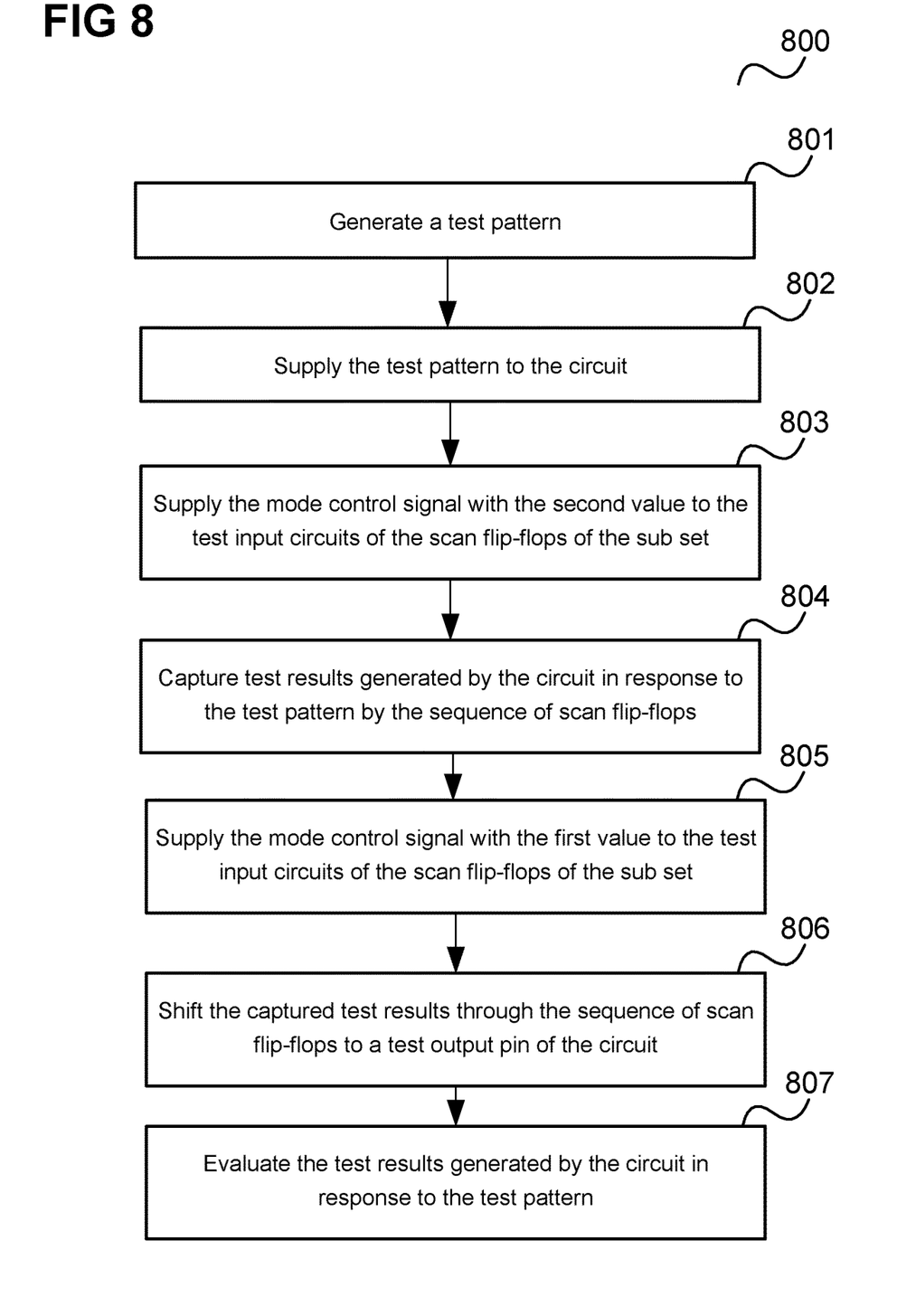
FIG. 8 shows a flow diagram illustrating a method for testing a circuit (as illustrated in FIG. 7).

According to various examples a method as illustrated in FIG. 8 is performed.

FIG. 8 shows a flow diagram illustrating a method for testing a circuit (as illustrated in FIG. 7).

In 801, a test pattern is generated.

In 802, the test pattern is supplied to the circuit.

In 803, the mode control signal with the second value is supplied to the test input circuits of the scan flip-flops of the sub set.

In 804, test results generated by the circuit in response to the test pattern by the sequence of scan flip-flops are captured.

In 805, the mode control signal with the first value is supplied to the test input circuits of the scan flip-flops of the sub set.

In 806, the captured test results are shifted through the sequence of scan flip-flops to a test output pin of the circuit.

In 807, the test results generated by the circuit in response to the test pattern are evaluated.

The method may be performed may be implemented by one or more processors, in this case implementing a (e.g. automatic) test tool. A "processor" may be understood as any kind of a logic implementing entity, which may be special purpose circuitry or a processor executing software stored in a memory, firmware, or any combination thereof. Thus a "processor" may be a hard-wired logic processor or a programmable logic processor such as a programmable processor, e.g. a microprocessor. A "processor" may also be a processor executing software, e.g. any kind of computer program. Any other kind of implementation of the respective functions which are described herein in more detail may also be understood as a "processor".

The following examples pertain to further exemplary implementations.

Example 1 is a circuit as described with reference to FIG. 7.

Example 2 is the circuit of Example 1, wherein the test circuit is configured to, in the shift mode, mask the test result provided by the part of the circuit by the second value of the mode control signal.

Example 3 is the circuit of Example 1 or 2, wherein the test circuit is configured to, in the capture mode, combine the test result provided by the part of the circuit with the content of the scan flip-flop preceding the scan flip-flop in the sequence.

Example 4 is the circuit of Example 3, wherein the combination includes an XOR (Exclusive-OR) combination.

Example 5 is a method for testing a circuit as described with reference to FIG. 8.

Example 6 is the method of Example 5, including supplying the test pattern to the circuit by supplying the mode control signal with the first value to the test input circuits of the scan flip-flops of the sub set and shifting the test pattern into the sequence of scan flip-flops.

Example 7 is the method of Example 5 or 6, including supplying another test pattern to the circuit by the mode control signal with the first value the test input circuits of the scan flip-flops of the sub set and shifting the other test pattern into the sequence of scan flip-flops, receiving test results generated by the circuit in response to the other test pattern and evaluating the test results generated by the circuit in response to the other test pattern.

Example 8 is the method of any one of Examples 5 to 7, wherein the part of the circuit is a sub-circuit of the circuit and wherein the circuit includes a further sequence of scan flip-flops, each scan flip-flop having a D input, a test enable input, a test input and a data output, wherein the circuit includes, for each scan flip-flop of at least a subset of the scan flip-flops of the further sequence, at the scan flip-flop's test input a respective test input circuit configured to, when supplied with a mode control signal having a first value, connect the test input to the output of the scan flip-flop preceding the scan flip-flop in the sequence such that the test input of the flip-flop is supplied with the content of the scan flip-flop preceding the scan flip-flop in the sequence, when supplied with a mode control signal having a second value, connect the test input to an output of a further sub-circuit of the circuit such that the test input of the flip-flop is supplied with a value depending on a test result provided by the further sub-circuit; wherein the test pattern is supplied to the circuit by supplying the first value to the test input circuits of the scan flip-flops of the subset of the scan flip-flops of the further sequence and shifting the test pattern into the further sequence of scan flip-flops.

It should be noted that one or more of the features of any of the examples above may be combined with any one of the other examples.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

REFERENCE SIGNS 100 integrated circuit
101 logic gates
102 test input pins
103 flip-flops
200 chip
201 wrapper cells
202 sub-circuit to be tested
203 test input pin
204 preceding circuit
205 subsequent circuit
206 further wrapper cells
207 further test input pin
208 test output pin
300 wrapper cell
302 circuit to be tested
304 preceding circuit
400 extended wrapper scan flip-flop
402 subsequent circuit
404 preceding circuit
405 circuit to be observed
406 OR gate
407 NXOR gate
408 test input
500 extended wrapper scan flip-flop
502 subsequent circuit
504 preceding circuit
505 circuit to be observed
506 OR gate
507 NXOR gate
508 test input
600 chip
601 input wrapper cells
602 middle circuit
603 test input pin
604 left circuit
605 right circuit
606 output wrapper cells
609, 610 chip components 700 circuit
701 wrapper scan flip-flops
702 test input circuit
703 part of the circuit
800 flow diagram
801-807 processing

The invention claimed is:

1. A circuit, comprising:
a plurality of scan flip-flops including a sequence of scan flip-flops, wherein at least some scan flip-flops of the sequence of scan flip-flops are wrapper scan flip-flops, each scan flip-flop of the sequence of scan flip-flops having a D input, a test enable input, a test input and a data output,
wherein the circuit comprises, for each scan flip-flop of at least a subset of the scan flip-flops of the sequence of scan flip-flops, at the scan flip-flop's test input a respective test input circuit comprising a plurality of logic gates, wherein the plurality of logic gates of the test input circuit is configured to,
when supplied with a mode control signal having a first value indicating a shift mode, connect the test input to the output of the scan flip-flop preceding the scan flip-flop in the sequence such that the test input of the scan flip-flop is supplied with the content of the scan flip-flop preceding the scan flip-flop in the sequence and
when supplied with the mode control signal having a second value indicating a capture mode, connect the test input to an output of a subcircuit of the circuit, wherein the subcircuit is under test, such that the test input of the flip-flop is supplied with a value depending on a test result provided by the subcircuit.

2. The circuit of claim 1, wherein the circuit is configured to, in the shift mode, mask the test result provided by the part of the circuit by the second value of the mode control signal.

3. The circuit of claim 1, wherein the circuit is configured to, in the capture mode, combine the test result provided by the part of the circuit with the content of the scan flip-flop preceding the scan flip-flop in the sequence.

4. The circuit of claim 3, wherein a combination of the test result and the content of the scan flip-flop comprises an XOR combination.

5. A method for testing a circuit according to claim 1 comprising:
generating a test pattern;
supplying the test pattern to the circuit;
supplying the mode control signal with the second value to the test input circuits of the scan flip-flops of the sub set;
capturing test results generated by the circuit in response to the test pattern by the sequence of scan flip-flops;
supplying the mode control signal with the first value to the test input circuits of the scan flip-flops of the sub set;
shifting the captured test results through the sequence of scan flip-flops to a test output pin of the circuit; and
evaluating the test results generated by the circuit in response to the test pattern.

6. The method of claim 5, comprising supplying the test pattern to the circuit by supplying the mode control signal with the first value to the test input circuits of the scan flip-flops of the sub set and shifting the test pattern into the sequence of scan flip-flops.

7. The method of claim 5, comprising supplying another test pattern to the circuit by the mode control signal with the first value the test input circuits of the scan flip-flops of the sub set and shifting the other test pattern into the sequence of scan flip-flops;
receiving test results generated by the circuit in response to the other test pattern; and
evaluating the test results generated by the circuit in response to the other test pattern.

8. The method of claim 5, wherein the part of the circuit is a sub-circuit of the circuit and wherein the circuit comprises a further sequence of scan flip-flops, each scan flip-flop having a D input, a test enable input, a test input and a data output, wherein the circuit comprises, for each scan flip-flop of at least a subset of the scan flip-flops of the further sequence, at the scan flip-flop's test input a respective test input circuit configured to,
when supplied with a mode control signal having a first value, connect the test input to the output of the scan flip-flop preceding the scan flip-flop in the sequence such that the test input of the flip-flop is supplied with the content of the scan flip-flop preceding the scan flip-flop in the sequence;
when supplied with a mode control signal having a second value, connect the test input to an output of a further sub-circuit of the circuit such that the test input of the flip-flop is supplied with a value depending on a test result provided by the further sub-circuit;
wherein the test pattern is supplied to the circuit by supplying the first value to the test input circuits of the scan flip-flops of the subset of the scan flip-flops of the further sequence and shifting the test pattern into the further sequence of scan flip-flops.

9. The circuit of claim 1, wherein the plurality of logic gates of the test input circuit comprises an OR-gate and an NXOR-gate.

10. The circuit of claim 9, wherein a first input of the OR-gate is connected to an output of a circuit to be observed, and a second input of the OR-gate is connected to a scan enable line; wherein an output of the OR-gate is connected to a first input of the NXOR-gate, and a second input of the NXOR-gate is connected to an output of a proceeding wrapper scan flip-flop.

* * * * *